United States Patent
Sung et al.

(10) Patent No.: US 8,709,897 B2
(45) Date of Patent: Apr. 29, 2014

(54) HIGH PERFORMANCE STRAINED SOURCE-DRAIN STRUCTURE AND METHOD OF FABRICATING THE SAME

(75) Inventors: Hsueh-Chang Sung, Zhubei (TW);
Ming-Huan Tsai, Zhubei (TW);
Hsien-Hsin Lin, Hsin-Chu (TW);
Chun-Fai Cheng, Hong Kong (CN);
Wei-Han Fan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/956,090

(22) Filed: Nov. 30, 2010

(65) Prior Publication Data
US 2012/0132957 A1    May 31, 2012

(51) Int. Cl.
*H01L 29/78*    (2006.01)
*H01L 21/336*    (2006.01)

(52) U.S. Cl.
USPC ........... 438/285; 257/192; 257/369; 257/288; 257/E29.255; 257/E21.438; 438/197; 438/225; 438/259; 438/270

(58) Field of Classification Search
USPC ............ 257/369, 288, 19, E27.062, E29.255; 438/197, 225, 259, 270
See application file for complete search history.

(56) References Cited

U.S. PATENT DOCUMENTS

| | | | | |
|---|---|---|---|---|
| 5,500,869 A * | 3/1996 | Yoshida et al. | ............ | 372/50.23 |
| 6,303,447 B1 * | 10/2001 | Chhagan et al. | ............ | 438/299 |
| 6,348,384 B1 * | 2/2002 | Lin | ............ | 438/279 |
| 7,071,065 B1 * | 7/2006 | Xiang et al. | ............ | 438/285 |
| 7,238,561 B2 * | 7/2007 | Zhang et al. | ............ | 438/197 |
| 7,413,958 B2 * | 8/2008 | Gunter et al. | ............ | 438/347 |
| 7,553,717 B2 * | 6/2009 | Chakravarthi et al. | ........ | 438/197 |
| 7,601,983 B2 * | 10/2009 | Ueno et al. | ............ | 257/51 |
| 2006/0115949 A1 * | 6/2006 | Zhang et al. | ............ | 438/300 |
| 2006/0138398 A1 * | 6/2006 | Shimamune et al. | ........... | 257/19 |
| 2006/0231877 A1 * | 10/2006 | Takenaka et al. | ............ | 257/296 |
| 2009/0061586 A1 * | 3/2009 | Yu et al. | ............ | 438/296 |
| 2009/0174002 A1 * | 7/2009 | Ouyang et al. | ............ | 257/369 |
| 2009/0261349 A1 * | 10/2009 | Lee et al. | ............ | 257/77 |
| 2010/0105184 A1 * | 4/2010 | Fukuda et al. | ............ | 438/299 |
| 2011/0024801 A1 * | 2/2011 | Cheng et al. | ............ | 257/255 |
| 2011/0079856 A1 * | 4/2011 | Tsai et al. | ............ | 257/369 |

\* cited by examiner

*Primary Examiner* — Lex Malsawma
*Assistant Examiner* — Sheng Zhu
(74) *Attorney, Agent, or Firm* — Haynes and Boone, LLP

(57) ABSTRACT

A method for forming a high performance strained source-drain structure includes forming a gate structure on a substrate and forming a pocket implant region proximate to the gate structure. Spacers are formed adjacent to the gate structure. A dry etch forms a recess with a first contour; a wet etch enlarge the recess to a second contour; and a thermal etch enlarges the recess to a third contour. The source-drain structure is then formed in the recess having the third contour.

20 Claims, 4 Drawing Sheets

HIGH PERFORMANCE STRAINED SOURCE-DRAIN STRUCTURE AND METHOD OF FABRICATING THE SAME

BACKGROUND

In some semiconductor devices, the implant region is formed only by dry etching. A proximity limitation is imposed on the implant region by the thickness of spacers formed on the sides of gate structures. This proximity limitation reduces the overall size of the implant region. Thus, semiconductor device boosting suffers due to this proximity limitation. As such, there exists a need to reduce the proximity limitation effects of dry etching.

SUMMARY

The present disclosure is directed to both processing methods and semiconductor devices. In one embodiment, the present disclosure describes a method for forming a high performance strained source-drain structure. The method includes forming a gate structure on a substrate and forming a pocket implant region proximate to the gate structure. Spacers are formed adjacent to the gate structure. A dry etch forms a recess with a first contour; a wet etch enlarge the recess to a second contour; and a thermal etch enlarges the recess to a third contour. The source-drain structure is then formed in the recess having the third contour.

In another embodiment, the method includes providing a substrate with defined gate structures and forming pocket implant regions proximate to the gate structures. Spacers are formed adjacent to and on either side of the gate structures to overlie the pocket implant regions. A dry etch on the substrate forms a recess with a first contour in the pocket implant regions; a wet etch on the recess enlarges the recess to a second contour; and a thermal etch further enlarges the enlarged recess to a third contour. A source-drain structure is formed in the enlarged recess having the third contour by depositing a semiconductor material such as Silicon-Germanium (SiGe).

In one embodiment, the present disclosure describes a semiconductor device with a high-performance strained source-drain region. The device includes a substrate having a defined gate structure with spacers and a pocket implant region formed proximate to the gate structure. The device also includes a recess formed in the pocket implant region of the substrate via a dry etch, a wet etch, and a thermal etch. The device further includes a source-drain structure formed in the recess by deposition of a semiconductor material including Silicon-Germanium (SiGe).

In one embodiment, the present disclosure describes a semiconductor device having a substrate with a gate structure thereon. The device includes spacers overlying opposite sidewalls of the gate structure. The device includes source-drain features in the substrate at either side of the gate structure. The source-drain features have upper sidewalls with a first facet and lower sidewalls with a second facet, wherein the first facet is different from the second facet. In one aspect, the substrate comprises Silicon (Si), and the source-drain features comprise Silicon-Germanium (SiGe). In another aspect, the first facet is <110>, and the second facet is <111>.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It should be appreciated that like reference numerals are used to identify like elements illustrated in one or more of the figures.

DETAILED DESCRIPTION

Figure 1:
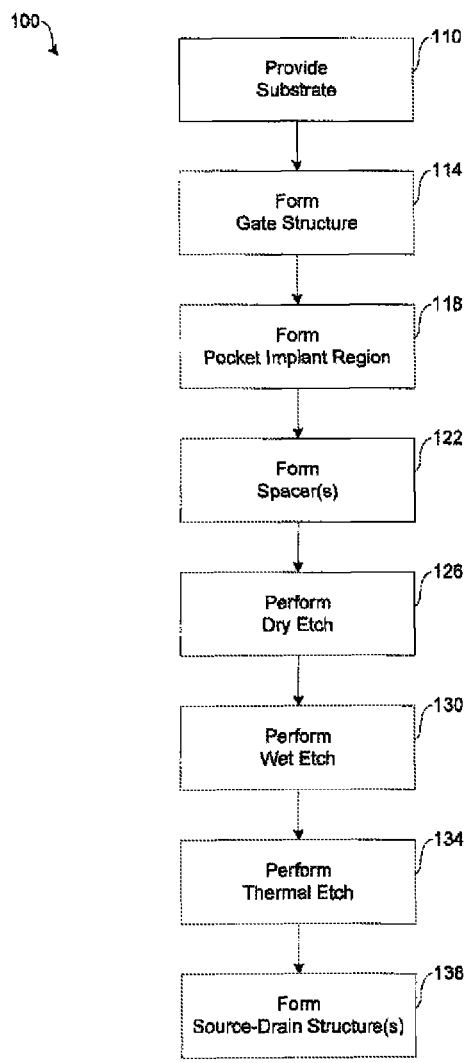
FIG. 1 shows a method for forming a source-drain structure, in accordance with an embodiment of the present disclosure.

It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," or "coupled to" another element or layer, it may be directly on, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

Embodiments of the present disclosure relate to source-drain structures including high performance strained source-drain structures and methods of fabricating the same.

Embodiments of the present disclosure provide device boosting and drain-induced barrier lowering (DIBL) control by a novel strain source drain (SSD) profile formation. In one aspect, device boosting is provided by the SSD profile due to a strain that is closer to the channel. Embodiments of the present disclosure utilize pre-bake of an epitaxial layer (EPI) deposition process and etching a self-aligned lightly doped drain (LDD) area to form the SSD profile.

FIG. 1 shows a method 100 for forming a source-drain structure, in accordance with an embodiment of the present disclosure. FIGS. 2A-2E shows a process flow for forming a source-drain structure, in accordance with an embodiment of the present disclosure. In one implementation, the method 100 of FIG. 1 and corresponding process flow of FIGS. 2A-2E may be utilized for fabrication of high performance strained source-drain structure.

Figure 2A:
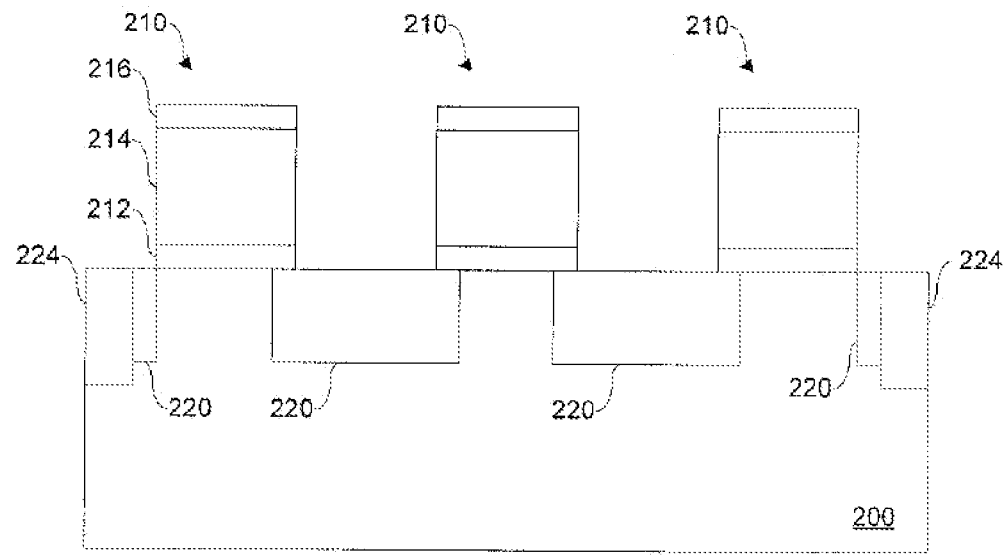
FIGS. 2A-2E shows a process flow for forming a source-drain structure, in accordance with an embodiment of the present disclosure.

Referring to FIG. 1, a substrate is provided (block 110) and a gate structure is formed on the substrate (block 114). In one embodiment, as shown in FIG. 2A, a substrate 200 comprising a semiconductor material, such as silicon (Si), is provided, and one or more gate structures 210 are formed on the substrate 200. The gate structures 210 include a gate oxide layer 212, a poly-silicon (poly-Si) layer 214, and a mask layer 216, such as hard mask layer for photo-lithographic processing. In one aspect, the gate layers 212, 214, 216 are formed on the substrate 200, and a poly-Si etch is performed to define the gate structures 210. In other embodiments, the substrate 200 may comprise a sapphire substrate, a silicon-carbide (SiC) substrate, a gallium-nitride (GaN) substrate, or various other composite substrates, without departing from the scope of the present disclosure.

Referring to FIG. 1, pocket implant regions are formed in the substrate proximate to the gate structures (block 118). In one embodiment, as shown in FIG. 2A, one or more pocket implant regions 220 are formed in the substrate 200 proximate to the gate structures 210. The pocket implant regions 220 comprise semiconductor dopant material, such as Arsenic (As), Phosphorus (P), or some combination of As and P (AsP). In one aspect, the pocket implant conditions may include 20~80 KeV, 1e12~1e14 atoms/cm2, and 15~45 tile angle. In another aspect, the pocket implant regions 220 may not include implantation of LDD (Light Doped Drain) of Boron (B) or Boron-Fluorine ($BF_2$). In one embodiment, the substrate 200 includes one or more shallow trench isolation (STI) structures 224 formed therein for electrical isolation.

Figure 2B:
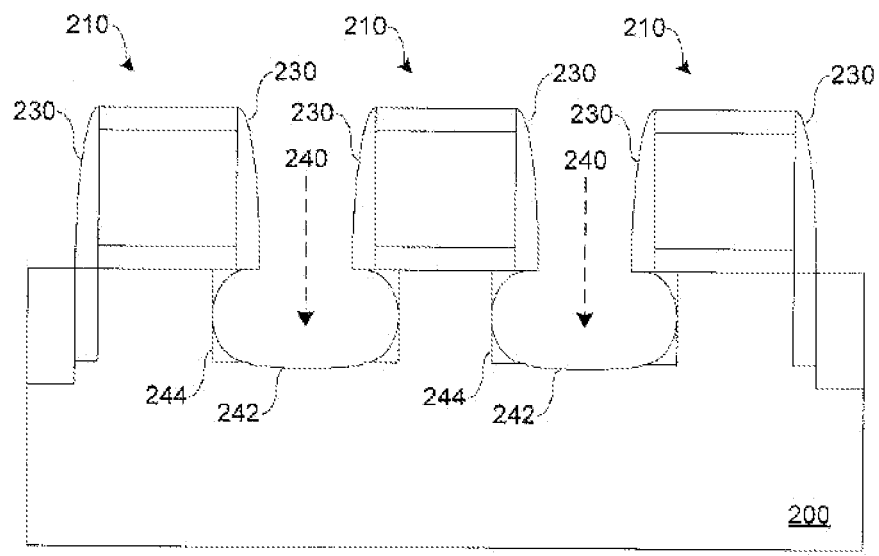

Referring to FIG. 1, spacers are formed adjacent to the gate structures (block 122). In one embodiment, as shown in FIG. 2B, one or more spacers 230 are formed adjacent to and on either side of the gate structures 210. The spacers 230 comprise a dielectric material, such as Silicon-Nitride (SiN), various oxide materials, or some combination of SiN and some oxide material. In one aspect, spacer deposition of SiN or OX/SiN is adapted to control proximity. SiN may include furnace SiN, ALD SiN, or PE SiN. Oxide may include thermal oxide, ALD oxide, or PEALD oxide. In various aspects, thickness of SiN may range from about 50 A to about 200 A, and thickness of Oxide may range from about 15 A to about 50 A.

Referring to FIG. 1, a dry etch is performed to form recesses in the implant regions of the substrate (block 126). In one embodiment, as shown in FIG. 2B, a dry isolation (ISO) etch 240 is performed to form one or more recesses 242 with a first contour or shape in the one or more pocket implant regions 220 of the substrate 200. In one aspect, the dry ISO etch is performed to define proximity. The ISO etch gas may comprise CF4/Cl2/NF3/SF6/He, and the depth of the recesses 242 may range from about 200 A to about 500 A. In one embodiment, the dry ISO etch 240 may form one or more pocket implant regions 244 for anti-punch through control.

Figure 2C:
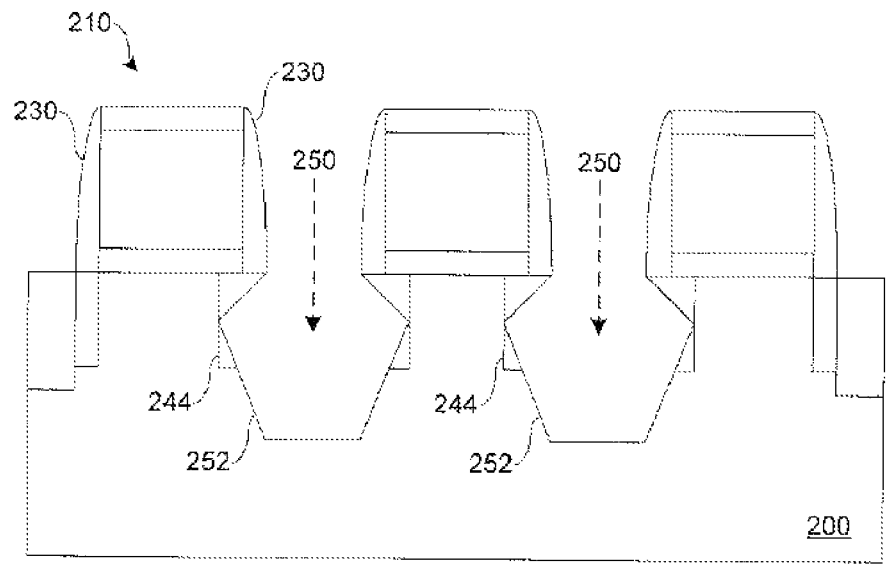

Referring to FIG. 1, a wet etch is performed to enlarge the dry etch recesses formed in the substrate (block 130). In one embodiment, as shown in FIG. 2C, a wet etch 250 by Tetra-Methyl-Ammonium Hydroxide (TMAH) is performed to enlarge the dry etch recesses 242 to form enlarged recesses 252 with a second contour or shape in the pocket implant regions 220 of the substrate 200. The wet etch by TMAH is utilized to form a (111) plane. In one aspect, the TMAH condition may include 20~100° C. and 1~30% concentration, and depth of the enlarged recesses 252 may range from about 400 A to about 800 A after TMAH etching.

Figure 2D:
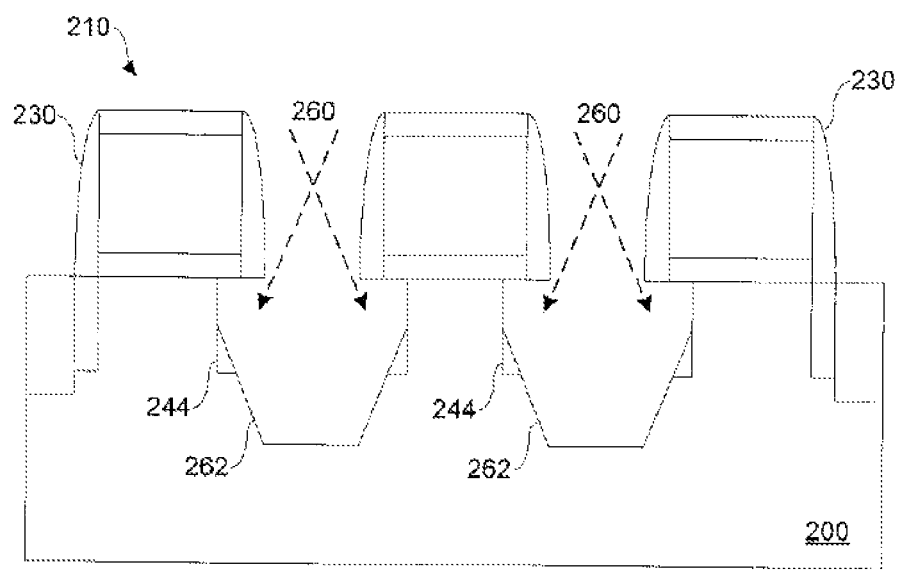

Referring to FIG. 1, a thermal etch is performed to enlarge the wet etch recesses formed in the substrate (block 134). In one embodiment, as shown in FIG. 2D, a thermal etch 260 by HCl (Hydro-Chloric Acid) or other thermal etch gas is performed to enlarge the wet etch recesses 252 to form enlarged recesses 262 with a third contour or shape in the pocket implant regions 220 of the substrate 200. In one aspect, as shown in FIG. 2D, the thermal etch is adapted to undercut one or more of the spacers 230 formed adjacent to the gate structures 210. In another aspect, the thermal etch is utilized as a pre-bake by HCl or other etch gas to etch the LDD area and self-align to the (110) plane. In still another aspect, the process parameters for HCl or other thermal etch gas may include 30~300 sccm, 500~900° C. temperature, H2 or N2 carrier gas, and 5~500 Torr.

Figure 2E:
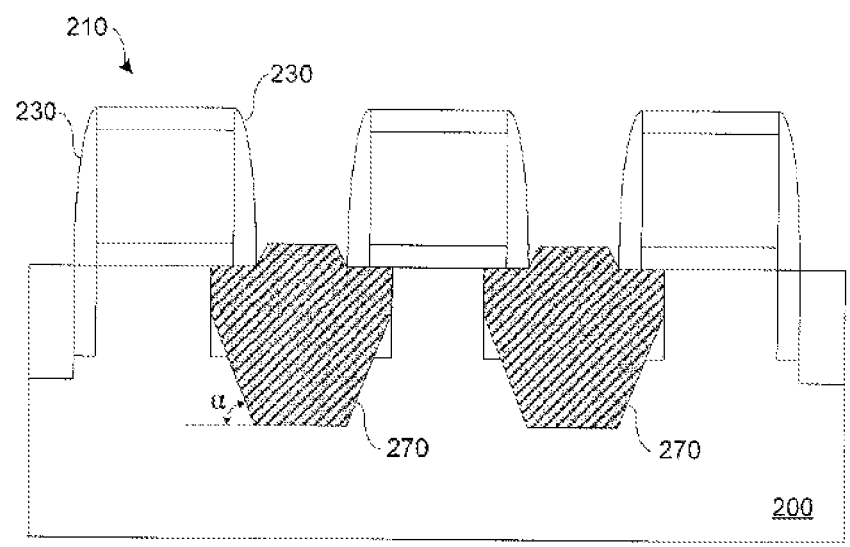

Referring to FIG. 1, source-drain structures are formed in the recesses of the substrate by deposition of a semiconductor material (block 138). In one embodiment, as shown in FIG. 2E, source-drain structures 270 are formed in the enlarged recesses 262 of the substrate 200 by deposition of a semiconductor material, such as Silicon-Germanium (SiGe). As shown in FIG. 2E, the source-drain structures 270 comprise the third contour or shape of the enlarged recesses 262. In one aspect, the source-drain structures 270 are formed by SiGe growth. In another aspect, proximity is controlled by thickness of spacers 230 and the dry ISO etch. In another aspect, an angle (α), such as 54%, and (111) facet is controlled by TMAH etch. In another aspect, LDD area etch is controlled by pocket implant and thermal etch.

In one aspect, recess source drain shape comprises three plane, two (110) plane that are vertical to the channel, one (100) plane that is parallel to the channel, and two (111) plane that connects the (100) and (110) plane. In another aspect, device boosting is provided by the novel SSD profile due to a strain that is closer to the channel. Embodiments of the present disclosure utilize pre-bake of an epitaxial layer (EPI) deposition process and etching a self-aligned lightly doped drain (LDD) area to form the SSD profile.

In one aspect, embodiments of the present disclosure utilize the LDD area etch. As such, no LDD implant is utilized. LDD implant, like $BF_2$, suppresses HCl thermal etch rate. Thus, if LDD implant is not performed, then Si etch rate near the LDD area is increased.

In accordance with embodiments of the present disclosure, a method for providing a substrate, forming a gate structure on the substrate, forming a pocket implant region proximate to the gate structure, forming spacers adjacent to the gate structure, performing a dry etch to form a recess with a first contour, performing a wet etch to enlarge the recess to a second contour, performing a thermal etch to enlarge the recess to a third contour, and forming a source-drain structure in the recess having the third contour.

In various implementations, the substrate comprises Silicon (Si), the substrate includes at least one shallow trench isolation (STI) structure, and the gate structure includes a gate oxide layer, a poly-silicon (poly-Si) layer, and a mask layer. The pocket implant region comprises dopant material including at lest one of Arsenic (As) and Phosphorus (P). The spacers are formed adjacent to and on either side of the gate structure, and the spacers comprise a dielectric material including at least one of Silicon-Nitride (SiN) and an oxide material. The dry etch comprises a dry isolation (ISO) etch that is performed to form the recess with the first contour in the pocket implant region of the substrate, and the recess with the first contour has a depth ranging from about 200 A to about 500 A. The wet etch comprises a wet etch by Tetra-Methyl-Ammonium Hydroxide (TMAH) that is performed to enlarge the recess formed by dry etching to form an enlarged recess with the second contour in the pocket implant region of the substrate, and the enlarged recess with the second contour has a depth ranging from about 400 A to about 800 A after TMAH etching is performed. The thermal etch comprises a thermal etch by HCl (Hydro-Chloric Acid) that is performed to enlarge the wet etch recess to form an enlarged recess with the third contour in the pocket implant region of the substrate, and the thermal etch is adapted to undercut the substrate adjacent the spacers. The source-drain structure is formed in the recess having the third contour by deposition of a semiconductor material including Silicon-Germanium (SiGe).

In accordance with embodiments of the present disclosure, a method for providing a substrate with defined gate structures, forming pocket implant regions proximate to the gate structures, forming spacers adjacent to and on either side of the gate structures to overlie the pocket implant regions, performing a dry etch on the substrate to form a recess with a first contour in the pocket implant regions, performing a wet etch on the recess to enlarge the recess to a second contour, performing a thermal etch on the enlarged recess to enlarge the enlarged recess to a third contour, and forming a source-drain structure in the enlarged recess having the third contour by depositing a semiconductor material including, for example, Silicon-Germanium (SiGe).

In accordance with embodiments of the present disclosure, a semiconductor device comprises a substrate with a gate structure formed thereon. The device includes spacers overlying opposite sidewalls of the gate structure. The device includes source-drain features in the substrate at either side of the gate structure. The source-drain features have upper sidewalls with a first facet and lower sidewalls with a second facet, wherein the first facet is different from the second facet. In one aspect, the substrate comprises Silicon (Si), and the source-drain features comprise Silicon-Germanium (SiGe). In another aspect, the first facet is <110>, and the second facet is <111>.

It should be appreciated that like reference numerals are used to identify like elements illustrated in one or more of the figures, wherein showings therein are for purposes of illustrating embodiments of the present disclosure and not for purposes of limiting the same.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method comprising:
   providing a semiconductor substrate;
   forming a gate structure on the semiconductor substrate;
   forming a pocket implant region proximate to the gate structure including a portion that is directly below the gate structure and physically contacting a dielectric layer of the gate structure, wherein after forming the pocket implant region a portion of the semiconductor substrate forming a channel of the gate structure physically contacts the dielectric layer of the gate structure and is free of the pocket implant region;
   forming spacers adjacent to the gate structure;
   performing a dry etch to form a recess with a first contour;
   performing a wet etch to enlarge the recess to a second contour;
   performing a thermal etch to enlarge the recess to a third contour, wherein performing the thermal etch to enlarge the recess to the third contour includes completely removing the portion of the pocket implant region that is directly below the gate structure and physically contacting the dielectric layer of the gate structure, wherein after performing the thermal etch to enlarge the recess to the third contour the portion of the substrate forming the channel of the gate structure physicall contacts the dielectric layer of the gate structure;
   forming a source-drain structure in the recess having the third contour; and
   wherein the dry etch, the wet etch, and the thermal etch are performed without a light doped drain (LDD) implantation process having been previously performed to form a LDD feature in the substrate proximate the gate structure.

2. The method of claim 1, wherein:
   the substrate comprises Silicon (Si),
   the substrate includes at least one shallow trench isolation (STI) structure, and
   the gate structure includes a gate oxide layer, a poly-silicon (poly-Si) layer, and a mask layer.

3. The method of claim 1, wherein:
   the wet etch comprises a wet etch by Tetra-Methyl-Ammonium Hydroxide (TMAH) that is performed to enlarge the recess formed by dry etching to form an enlarged recess with the second contour in the pocket implant region of the substrate, and
   the enlarged recess with the second contour has a depth ranging from about 400A to about 800A after TMAH etching is performed.

4. The method of claim 1, wherein:
   the thermal etch comprises a thermal etch by HC1 (Hydro-Chloric Acid) that is performed to enlarge the wet etch recess to form an enlarged recess with the third contour in the pocket implant region of the substrate, and
   the thermal etch is adapted to undercut the substrate adjacent the spacers.

5. The method of claim 1, wherein:
   the source-drain structure is formed in the recess having the third contour by deposition of a semiconductor material including Silicon-Germanium (SiGe).

6. The method of claim 1, wherein forming the source-drain structure in the recess having the third contour occurs after performing the thermal etch to enlarge the recess to the third contour.

7. The method of claim 1, wherein a bottommost portion of the pocket implant region extends to a first depth within the substrate; and
   wherein a bottommost portion of the second contour of the recess extends beyond the first depth to a second depth within the substrate, the second depth being greater than the first depth.

8. A method comprising:
   providing a substrate with a gate structure;
   forming a pocket implant region proximate to the gate structure including a portion that is directly below the gate structure and physically contacting a dielectric layer of the gate structure, wherein after forming the pocket implant region a portion of the substrate forming a channel of the gate structure physically contacts the dielectric layer of the gate structure and is free of the pocket implant region;
   forming spacers adjacent to and on either side of the gate structure to overlie the pocket implant region;
   performing a dry etch on the substrate to form a recess with a first contour in the pocket implant region;
   performing a wet etch on the recess to enlarge the recess to a second contour;
   performing a thermal etch on the enlarged recess to enlarge the enlarged recess to a third contour, wherein performing the thermal etch on the enlarged recess to enlarge the enlarged recess to the third contour includes completely removing the portion of the pocket implant region that is directly below the gate structure and physically contacting the dielectric layer of the gate structure, wherein after performing the thermal etch the portion of the substrate forming the channel of the gate structure physically contacts the dielectric layer of the gate structure; and forming a source-drain structure in the enlarged recess having the third contour by depositing a semiconductor material including Silicon-Germanium (SiGe).

9. The method of claim 8, wherein:
the substrate comprises Silicon (Si),
the substrate includes at least one shallow trench isolation (STI) structure, and
the gate structure includes a gate oxide layer, a poly-silicon (poly-Si) layer, and a mask layer.

10. The method of claim 8, wherein the pocket implant regions comprise dopant material including at least one of Arsenic (As) and Phosphorus (P).

11. The method of claim 8, wherein:
the dry etch comprises a dry isolation (ISO) etch that is performed to form the recess with the first contour in the pocket implant region of the substrate, and
the recess with the first contour has a depth ranging from about 200A to about 500A.

12. The method of claim 8, wherein:
the wet etch comprises a wet etch by Tetra-Methyl-Ammonium Hydroxide (TMAH) that is performed to enlarge the recess formed by dry etching to form an enlarged recess with the second contour in the pocket implant region of the substrate, and
the enlarged recess with the second contour has a depth ranging from about 400A to about 800A after TMAH etching is performed.

13. The method of claim 8, wherein:
the thermal etch comprises a thermal etch by HCl (Hydro-Chloric Acid) that is performed to enlarge the wet etch recess to form an enlarged recess with the third contour in the pocket implant region of the substrate, and
the thermal etch is adapted to undercut the substrate adjacent the spacers.

14. The method of claim 8, wherein performing the dry etch on the substrate to form the recess with the first contour in the pocket implant regions includes performing a dry isotropic etch on the substrate to form the recess with the first contour in the pocket implant regions, and
wherein forming the source-drain structure in the enlarged recess having the third contour by depositing the semiconductor material including Silicon-Germanium (SiGe) occurs after completion of the performing the thermal etch on the enlarged recess to enlarge the enlarged recess to the third contour.

15. The method of claim 8, wherein the dry, wet, and thermal etches and forming the source-drain structure in the enlarged recess having the third contour by depositing the semiconductor material including SiGe are performed without a light doped drain (LDD) implantation process having been previously performed to form a LDD feature in the substrate proximate the gate structure.

16. A method comprising:
forming a gate structure on a substrate;
forming a pocket implant region proximate to the gate structure including a portion that is directly below the gate structure and physically contacting a dielectric layer of the gate structure, wherein after forming the pocket implant region a portion of the substrate forming a channel of the gate structure physically contacts the dielectric layer of the gate structure and is free of the pocket implant region;

performing a first etch to form a recess with a first contour;
performing a second etch to enlarge the recess to a second contour performing a third etch to enlarge the recess to a third contour, wherein performing the third etch to enlarge the recess to the third contour includes completely removing the portion of the pocket implant region that is directly below the gate structure and physically contracting the dielectric layer of the gate structure, wherein after performing the third etch the portion of the substrate forming the channel of the gate structure physically contacts the dielectric layer of the gate structure; and forming a source-drain structure in the recess having the third contour,
wherein the first, second, and third etch are different from each other.

17. The method of claim 16, wherein the first etch is a dry etch,
wherein the second etch is a wet etch, and
wherein the third etch is a thermal etch.

18. The method of claim 17, wherein the third etch is a thermal etch, the thermal etch forming the third contour of the recess to include a sidewall portion having a {110} plane.

19. The method of claim 16, wherein one of the first and second etches is a dry etch and the third etch is a thermal etch.

20. The method of claim 16, wherein the first, second, and third etches and forming the source-drain structure in the recess having the third contour are performed without a light doped drain (LDD) implantation process having been previously performed to form a LDD feature in the substrate proximate the gate structure.

* * * * *